(12) United States Patent
Andrieu et al.

(10) Patent No.: US 6,437,959 B1
(45) Date of Patent: Aug. 20, 2002

(54) ELECTRICAL AND/OR ELECTRONIC SYSTEM INTEGRATED WITH AN ISOLATING DEVICE AND METHOD THAT ISOLATES A FUNCTIONAL MODULE

(75) Inventors: Claude Andrieu, Rennes; Marc Hourdequin, Luillé ; Jean-Claude Besset, Guichen, all of (FR)

(73) Assignee: Delegation Generale pour l'Armement, Armees (FR)

( * ) Notice: Subject to any disclaimer, the term of this patent is extended or adjusted under 35 U.S.C. 154(b) by 0 days.

(21) Appl. No.: 09/452,132

(22) Filed: Dec. 1, 1999

(30) Foreign Application Priority Data

Dec. 1, 1998 (FR) .............................................. 98 15103

(51) Int. Cl.⁷ ................................................. H02H 5/00
(52) U.S. Cl. ............................. 361/103; 361/18; 361/58
(58) Field of Search ................................. 361/115, 103, 361/104, 58, 18

(56) References Cited

U.S. PATENT DOCUMENTS 3,737,725 A   6/1973   Donnelly ..................... 317/16

FOREIGN PATENT DOCUMENTS

JP   A 57-66589   4/1982   ............ G11C/11/34
JP   A 6-139916   5/1994   ............ H01H/85/04

*Primary Examiner*—Stephen W. Jackson
(74) *Attorney, Agent, or Firm*—Oliff & Berridge, PLC

(57) ABSTRACT

The invention relates to an integrated electrical and/or electronic system having at least one functional module connected to a supply voltage and connected via a pin external to the functional module or the electrical system by an electrical terminal. The system may include an isolation device for electrically isolating the functional module, including a fuse whose first pole is connected to a pin of the functional module and the second pole that corresponds to the external electrical terminal, and a semiconductor dipole that can be energized by a priming voltage. A first pole of the semiconductor dipole is connected to the first pole of the fuse and the second pole is externally accessible. A second dipole whose first pole is connected to the pin of functional module and the second pole, is connected to a preset voltage, so that application of a sufficient isolating voltage relative to the priming voltage between the second pole of the fuse and the second pole of the energizable semiconductor dipole causes fuse to physically break, and, thereafter, via a preset voltage on the pin is exclusively maintained which enables the voltage enabling the operation of the functional module to be controlled.

14 Claims, 1 Drawing Sheet

ELECTRICAL AND/OR ELECTRONIC SYSTEM INTEGRATED WITH AN ISOLATING DEVICE AND METHOD THAT ISOLATES A FUNCTIONAL MODULE

BACKGROUND OF THE INVENTION

1. Field of Invention

The invention relates to integrated electrical and/or electronic circuits.

2. Description of Related Art

Systems for protecting functional systems against overvoltages are known. Here, one may cite U.S. Pat. No. 3,737,725 which describes a circuit overvoltage protector having a fuse and a zener diode arranged in the electrical supply circuit of the functional module.

Also, designers of integrated electrical and/or electronic circuits often provide electrical terminals to one or more functional modules of an electrical and/or electronic system, in addition to electrical power supplies. Such external electrical terminals prove necessary, for example, for programming or configuring the functional module, to input a specific code into the system (and/or to a user), or to test, measure, and/or calibrate the functional module.

When the testing, calibration, or programming phase is complete, it may be desirable effectively to isolate the functional module from elements outside of the functional module or the electrical system. In other words, it is necessary to eliminate the external electrical terminal to prevent changes in the programming, configuration, or coding and/or to ensure better protection for the functional module, particularly against powerful electromagnetic fields and/or ultraviolet radiation which may be encountered in an industrial setting for example. Such isolation is also required in very harsh environments such as those that may be encountered in the space and nuclear arenas.

Various techniques have already been proposed to achieve this result. Thus, numerous devices that program by isolation are known. They generally call on physical circuit-breaking techniques, for example, using mechanical methods for applying laser beams, electrical segmentation using semiconductor switches, or by inhibiting logical accesses from the nonvolatile memory programming. The first method has the advantage of physically breaking off access to the terminal. However, it has the disadvantage of being implemented only when the electrical and/or electronic system is being manufactured, and before the system housing and/or protective device is sealed with resins or varnishes. Hence, this technique cannot be used by the end user, who is thus, unable to carry out the programming, configuration, or testing operations listed above.

The second set of techniques, based on the programming of memories or semiconductor switches, also has several drawbacks. To begin with, these techniques call on sophisticated, fragile, relatively expensive, and sometimes bulky components. They also do not enable their own programming to be protected by radically eliminating access paths.

Moreover, the technology based on floating-grid cells that is generally used has the drawback of substantial sensitivity to harsh environments, powerful electromagnetic fields, and ultraviolet radiation.

SUMMARY OF THE INVENTION

The main aspect of the invention is to overcome these drawbacks of the prior art. More specifically, one of the aspects of the invention is to provide a technique that effectively eliminates the external electrical terminal connected to a functional module that needs to be isolated (for example, after a testing, measurement, calibration, programming, configuration, or coding, etc. phase).

An additional aspect of the invention is to provide such a technique permitting utilization in harsh environments and/or in the presence of electromagnetic field(s) and/or high environmental radiation.

Another aspect of the invention is to provide such a technique whose cost, development, and/or implementation are reduced by comparison to known techniques.

Another aspect of the invention is to provide a device for electrical isolation of a functional module enabling the functional module to be programmed (particularly the decision as to the moment in time of isolation) by the end user.

These various aspects, as well as others that will emerge in the following text, are achieved according to the invention with the aid of an integrated electrical and/or electronic system that has at least one functional module connected to a supply voltage and connected via a pin external to the functional module by an electrical terminal. An isolation device electrically isolates the electrical terminal from the functional module, The isolation device may include a fuse whose first pole is connected to the pin of the functional module and the second pole corresponds to the external electrical terminal, a first semiconductor dipole that can be energized by a priming voltage, a first pole of which is connected to the first pole of the fuse and the second pole is externally accessible to the system, and a second dipole whose first pole is connected to the pin of the functional module and the second pole is connected to a preset voltage.

Therefore, application of a sufficient isolating voltage relative to the priming voltage between the second pole of the fuse and the second pole of the energizable semiconductor dipole causes the fuse to break physically, and thereafter, a preset voltage on the pin is exclusively maintained via the second dipole. Thus, after the fuse has broken, this voltage enables the operation of the functional module to be controlled.

The general principle of the invention is thus based on the combination of three single components (a fuse, an energizable semiconductor dipole, and a second dipole). By internally or externally controlling the breakage of the fuse, such a combination enables the functional module to be electrically isolated permanently at the desired point in time.

It is thus possible to program the moment in time at which the fuse breaks either by external, for example, human, intervention by manually operating an adequate isolating voltage or by internal control, for example, with the development of one or more particular conditions linked to the environment causing an isolating voltage to be generated.

It is important to note that exceeding a threshold voltage (imposed by the presence of the energizable semiconductor dipole) is necessary for programming the prohibition of electrical terminal to the functional module. As long as the fuse has not been broken, neither the fuse nor the dipoles disrupts operation of the system, and access to the functional module is direct.

Since the isolating voltage can be applied to the electrical terminal from the outside the system or the functional module, this system has the advantage of being accessible by the end user before this electrical terminal is eliminated, and prohibits all electrical terminals to the functional module. Electrical terminal to the functional module can be so prohibited, for example, following programming or testing of the functional module.

It will be noted that the technique of the invention can easily be duplicated within a single system (access to several modules and/or several accesses to one module). It can also easily be adapted to isolation between two functional modules.

The second dipole enables the preset voltage to be maintained for the terminal to the functional module after the fuse is broken. Thus, when the fuse has broken, the input to the functional module is permanently configured at a given value (which can in particular indicate to the module that it is henceforth isolated).

According to a first embodiment of the invention, the preset voltage is created internal to the system and/or corresponds to a predetermined logic level. For example, when the logic level is "1," a pin is connected to a polarizing voltage of the functional module by way of an element having a resistance with a sufficiently high equivalent impedance value to not disrupt operation of the electrical terminal before the fuse breaks.

According to a second embodiment of the invention, when the logic level is "0," the pin is connected to a polarizing voltage of the functional module by way of an element having a resistance with a sufficiently high equivalent impedance value so as to not disrupt operation of the electrical terminal before the fuse breaks.

Advantageously, the element with a resistance belongs to the group including, resistors, and MOSFET-type resistors. This list is by no means exhaustive. Indeed, it will be understood that any type of element having a high impedance value under the conditions of its operation and/or the operation of the system may be appropriate as an element with resistance.

Advantageously, the energizable semiconductor dipole belongs to the group including "zener"-type diodes and "transil"-type diodes. However, it is clear that any type of dipole that provides a conducting state during operation by applying an isolating voltage to its terminals, may be appropriate.

According to one particular embodiment of the invention, the system has an internal device for generating the isolating voltage. It will be noted that the internal device for generating the isolating voltage can in particular be placed inside the functional module.

According to one embodiment of the invention, an external device for generating the isolating voltage, that the user can simply apply to the terminals of the system, can be provided.

In one particular embodiment of the invention, the functional module has a controller for controlling the internal device for generating the isolating voltage. According to this embodiment, the controller can be designed to control the external isolating voltage generator. Such a characteristic enables the system to function entirely autonomously since it no longer requires an additional external command.

The fuse may be made of any type of suitable material, for example, a nickel-chrome (or NiCr) alloy on a glass, alumina (or $Al_2O_3$) and/or ceramic substrate.

Advantageously, the electrical terminal is used for at least one of the operations belonging to the group, including programming of the functional module, configuration of the functional module, calibration of the functional module, receiving data or signals from the functional module, testing of the functional module, inserting a code into the functional module. It is clear that this list is, however, not exhaustive.

According to one advantageous embodiment of the invention, the system has at least two electrical terminals, each associated with different isolation device. It will be understood that the provision of a plurality of electrical terminals external to the functional module or system implies providing at least one fuse on each electrical terminal.

Preferably, the system belongs to the group including, integrated circuits (for example, hybrid or monolithic circuits), electronic circuits, and electrical circuits. Of course, this list is not exhaustive.

The invention also relates to an electrical isolating device of an electrical terminal of a functional module built into an electrical and/or electronic system, the functional module being connected to a supply voltage and connected external to the functional module by an electrical terminal via a pin. According to the invention, the isolating device electrically isolates the functional module, including a fuse whose first pole is connected to the pin of the functional module and the second pole corresponds to the external electrical terminal, a semiconductor dipole energizable under the influence of a priming voltage, a first pole of which is connected to the first pole of the fuse and the second pole is externally accessible to the device, a second dipole whose first pole is connected to the pin of the functional module and the second pole is connected to a preset voltage, such that application of a sufficient isolating voltage relative to the priming voltage between the second pole of the fuse and the second pole of the energizable semiconductor dipole causes physical breakage of the fuse, and thereafter, a preset voltage on the pin is exclusively maintained via the second dipole of the functional module. This voltage then enables the operation of the functional module to be controlled.

The invention also relates to an electrical isolating process designed to be used by the above-described system. According to the invention, the process includes a stage of electrically isolating the functional module by applying a sufficient isolating voltage relative to the priming voltage between the second pole of the fuse and the second pole of the energizable semiconductor dipole which causes physical breakage of the fuse, and thereafter, a preset voltage on the pin is exclusively maintained via the second dipole of the functional module. Thus, this voltage enables the operation of the functional module to be controlled.

The invention can in particular be used in an integrated electrical and/or electronic system used in powerful electromagnetic fields and/or ultraviolet radiation. Thus, the system is included in an environment belonging to the group that may include industrial environments, nuclear environments, and space environments.

BRIEF DESCRIPTION OF THE DRAWINGS

Other characteristics and advantages of the invention will emerge from reading the following description of the preferred embodiments of the invention provided to be simply illustrative, and not limiting, and the attached drawings wherein.

DETAILED DESCRIPTION OF PREFERRED EMBODIMENTS

Preferred embodiments of the invention will be described in detail with reference to the figures. The invention thus relates to an integrated electrical and/or electronic device enabling a functional module that had been externally accessible, to be isolated by prohibiting this access.

Figure 1:
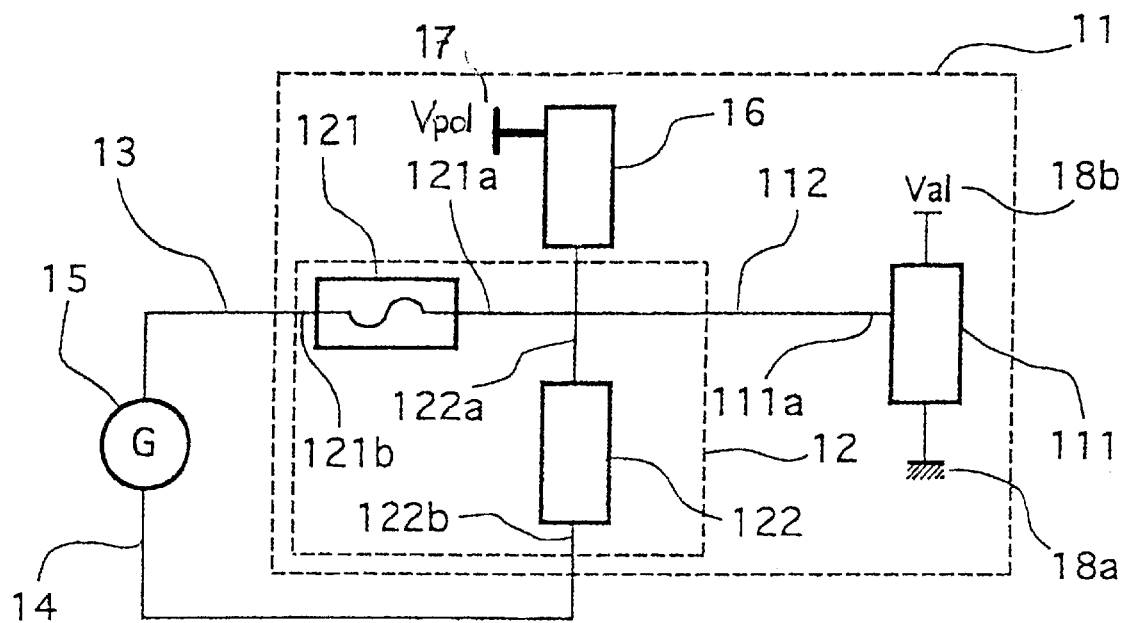
FIG. 1 is a diagram of an integrated electrical and/or electronic system with an electrical isolating device according to the invention.

A particular embodiment of an integrated electrical and/or electronic system 11 provided with an electrical isolation device 12 according to the invention will now be presented in relation to the diagram of FIG. 1. The integrated electrical and/or electronic system 11 has an isolating device 12 and at least one functional module 111. This functional module 111 is an electrical and/or electronic element having at least one function. It can for example use a command, a logic value, and/or a digital code externally supplied during its initial operation.

To accomplish this, functional module 111 is externally connected by an electrical terminal 13 via an electrical terminal 112. It has a high input impedance (by comparison to the impedance of electrical isolation device 12, namely that of a fuse 121 augmented by that of an energizable semiconductor dipole 122 in its conducting state and augmented by the impedance of a dipole 16 connected to a polarizing voltage, both as described hereinbelow, such that functional module 111 is not disrupted by application of the isolating voltage. Functional module 111 is also connected to a ground 18a and a supply voltage $V_{a1}$ 18b.

The electrical terminal 13 connected to functional module 111 is used, for example, for at least one of programming, configuring, calibrating, receiving data or signals, testing and/or inserting a digital code for functional module 111.

According to the invention, electrical system 11 has an electrical isolation device 12 for electrical isolation of functional module 111, including a fuse 121 of which a first pole 121a is connected to a pin 111a of the functional module 111, and second pole 121b that corresponds to external electrical terminal 13. Pin 111a is an input and/or an output of functional module 111. The electrical system 11 also includes a semiconductor dipole 122 energizable under the influence of a priming voltage, of which a first pole 122a is connected to first pole 121a of fuse 121 and second pole 122b being externally accessible via an electrical terminal 14 to the electrical system 11, and a second dipole 16 whose first pole is connected to the pin 111a of the functional module 111 and the second pole is connected to a preset voltage 17.

Thus, by controlling the breakage of fuse 121, a combination of a fuse 121 and dipoles 122 and 16, enables functional module 111 to be isolated while allowing it to continue to operate under nominal conditions because it retains its electrical supply 18b and its polarization at pin 111a. To accomplish this, breakage of the fuse 121 is controlled with the aid of voltage generator 15 for generating the isolating voltage which is located, for example, external to electrical and/or electrical system 11.

The generator 15 for generating the isolating voltage is connected, for example, between external electrical terminals 13, 14. They have a low output impedance relative to that of fuse 121 augmented by that of energizable semiconductor dipole 122 when the latter is primed and augmented by the impedance of polarized dipole 16, such that the voltage generator 15 does not prevent proper operation of electrical isolation device 12. The fact that the voltage generator 15 is external enables a user of system 11 to control the isolation of functional module 111 at any time without using any complex device within electrical system 11.

Figure 2:
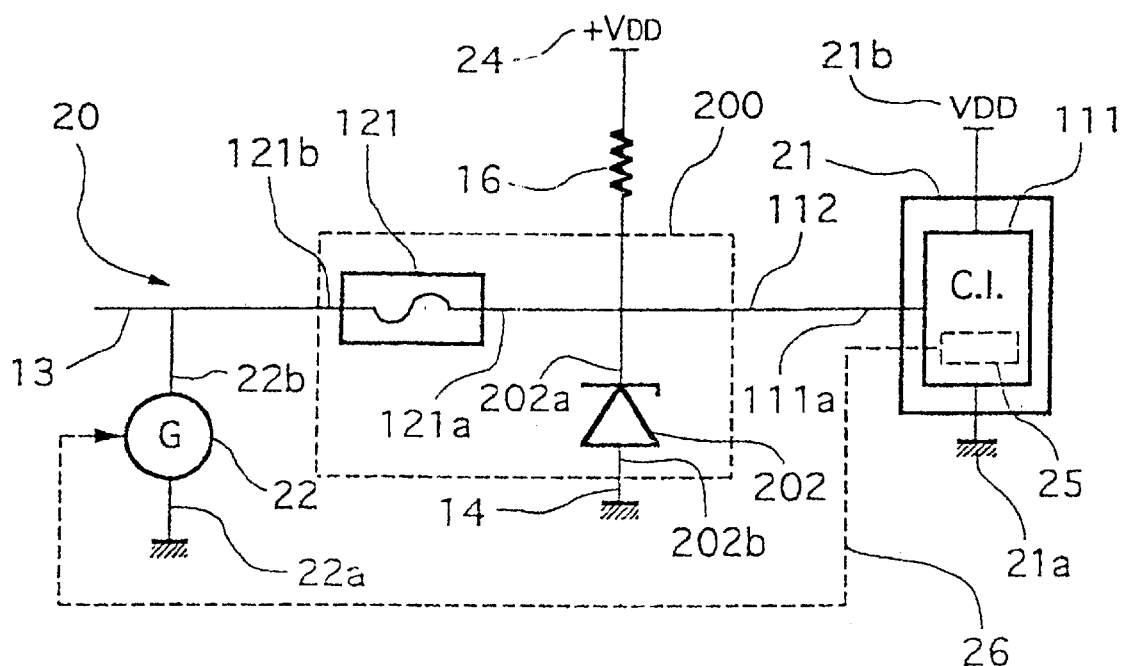
FIG. 2 is a simplified diagram of a particular embodiment of a system according to the invention with a device for electrically isolating an integrated functional module.

However, of course, voltage generator 15 can also be internal to electrical system 11 (as illustrated in FIG. 2) which has the advantage of not requiring any external equipment to generate the isolating voltage.

It will be noted that isolation of the functional module 111 is possible even though one of the poles of the fuse 121, namely that connected to the functional module 111, is externally inaccessible.

This isolation is thus obtained by application of a voltage that exceeds the threshold voltage (priming voltage) characterizing energizable semiconductor dipole 122, and causes semiconductor dipole 122 to enter the conducting state. This simultaneously entails passage of current through fuse 121. The intensity of the current passing through fuse 121 then reaches a breakdown current of fuse 121, which causes fuse 121 to physically break.

It is then clearly impossible for any electrical signal to pass in the direction of functional module 111 (via electrical terminals 13, 112). Functional module 111 is thus isolated from any external electrical terminal.

The present invention thus offers a simple, efficient architecture to prevent electrical access to a functional module 111. Once fuse 121 is open, dipole 16 maintains a preset voltage 17 at the electrical terminal 112 to functional module 111 after fuse 121 has broken. This preset voltage can correspond to a predetermined logic level, such as, for example, a high level at "1" or a low level at "0."

In a first situation, pin 111a is connected to a polarizing preset voltage 17 of functional module 111 so that the logic level is at "1," by way of dipole 16 having a resistance that has an equivalent impedance value sufficiently high as not to disrupt operation of electrical terminal 112 to functional module 111 before fuse 121 breaks.

In the second situation, for the logic level to be at "0," pin 111a is connected to a polarizing voltage of the functional module 111 by way of a dipole 16 that has an equivalent impedance value resistance sufficiently high as not to disrupt operation of electrical terminal 112 to functional module 111 before fuse 121 breaks.

Any other voltage of a logical value can be applied in the same way. This voltage is irreversible within the context of this embodiment.

According to one embodiment of the invention (not shown), electrical system 11 has a plurality of electrical terminals each provided with a fuse 121 in order to provide several terminals to one or more functional modules 111.

As shown in FIG. 2, another particular embodiment of a system 20 according to the invention for electrically isolating an integrated functional module 111 provided with an electrical isolating device 200, will now be presented. This system 20 is integrated for example into an electrical and/or electronic system (not shown). The elements described with reference to FIG. 1 have the same reference numerals. Only the aspects specific to this embodiment will be described here.

The dipole 16 in FIG. 1, is shown as a pull resistor 16 with a high impedance of, for example, several hundred kOhms, according to the embodiment shown in FIG. 2. According to one embodiment, a MOSFET transistor, for example, which also has a relatively high impedance, may be considered.

The energizable semiconductor dipole 122 in FIG. 1, is replaced by a reverse-polarized "zener"-type diode 202 in FIG. 2. The anode of zener diode 202 is connected to ground 202b and cathode 202a is connected to terminal 121a of fuse 121 and pull resistor 16, and also to electrical terminal 112 of functional module 111.

As long as the voltage applied to the terminals of zener diode 202 is less than its priming voltage, no current passes through it. To render zener diode 202 conducting, voltage generator 22 (i.e., built into electrical isolating system 20) for generating the isolating voltage higher than the priming voltage, applies a positive isolating voltage, for example, greater than 6 volts. According to one embodiment of the invention (not shown), the voltage generator 22 is, for example, included in functional module 111.

According to a preferred embodiment of the invention (shown by dashed lines in FIG. 2), functional module 111 has a controller 25 for controlling the voltage generator 22 that generates the isolating voltage. To accomplish this, controller 25 delivers a control signal intended for the internal isolating voltage generator 22, via a link 26. This control signal activates internal isolating voltage generator 22. This signal can, in particular, be generated once a harsh environment is detected.

It is clear that the priming voltage limited by zener diode 202 must remain less than the maximum permissible voltage at the input of functional module 111 so that application of the isolating voltage does not embrittle the latter. The voltage applied by isolating voltage generator 22 may be in the DC form and/or in the form of one or more pulses. According to one embodiment, the zener diode 202 can be polarized directly so that the isolating voltage generator 22 must generate an isolating negative overvoltage, for example, less than "−6 volts", to make the diode conduct.

According to another embodiment of the invention (not shown), zener diode 202 may be "transil"-type diode.

Once fuse 121 has broken, zener diode 202 returns to the blocked state that it assumed before the isolating positive overvoltage was applied following breakage of fuse 121. For its part, fuse 121 may be made of a nickel-chrome (NiCr) alloy, for example. Fuse 121 is designed to break when excess current passes through its two poles 121a, 121b. This excess current is supplied to fuse 121 when the zener diode 202 is energized.

In the embodiment shown, a fuse 121 made of NiCr alloy 16 μm wide, 30 μm long, and 15 nm thick on a substrate can be used, for example. The substrate may be made of, for example, glass whose resistance is substantially equal to 190 ohms (corresponding to 100 ohms/square) and breaks at a minimum current of approximately 25 mA, or alumina ($Al_2O_3$) whose resistance is substantially equal to 130 ohms (corresponding to 70 ohms/square) and breaks at a minimum current of approximately 60 mA.

According to embodiments, fuse 121 can also be made of a nickel-chrome alloy on a ceramic substrate. It will be understood that the resistance of fuse 121 is chosen such that it does not break in the prior programming, testing, calibration, configuration, etc. stages.

Pull resistor 16, supplied with a supply voltage $V_{DD}$ 24 of, for example, 5 volts, maintains a logic level at "1" at the input to functional module 111 once fuse 121 has broken. Functional module 111 is, for example, an integrated circuit of the CMOS type and is supplied with a voltage between a supply voltage $V_{DD}$ 21b equal to 5 volts and ground 21a.

The system 20 according to the invention can also be an integrated circuit of any type (in particular a hybrid integrated circuit or a monolithic integrated circuit), an electronic circuit, or an electrical circuit. In the case of an electronic circuit, it may be protected by at least one coating material such as one or more layers of varnish and/or one or more layers of resin. Also, in the case of an electrical circuit, the latter may be closed or sealed.

The invention also relates to a method for isolating a functional module 111, implemented by the electrical isolation devices 12 and 200 discussed above. This method includes a stage of electrical isolation of the functional module 111 by application of a sufficient isolating voltage relative to the priming voltage between the second pole of the fuse 121 and the second pole of the energizable semiconductor dipole 16 to cause the fuse 121 to physically break, and hence, a preset voltage on the pin is exclusively and irreversibly maintained via the second dipole of the functional module 111, results.

The device and/or the system according to the invention can in particular be used in certain systems having at least one programmable device and used in powerful electromagnetic fields and/or ultraviolet radiation, generated, in particular, in industrial, nuclear, and/or space environments.

While the invention has been described with reference to the embodiments, it is to be understood that the invention is not restricted to the particular forms shown in the foregoing embodiments. Various modifications and alternations can be made thereto without departing from the scope of the invention.

What is claimed is:

1. An integrated electrical and/or electronic system, comprising:
    at least one functional module connected to a supply voltage and also connected to a pin external to the functional module via an electrical terminal; and
    an isolation device that electrically isolates the functional module, comprising:
        a fuse having a first pole connected to the pin of the functional module and a second pole connected to the external electrical terminal;
        a semiconductor dipole that is energized by a priming voltage, the semiconductor dipole having a first pole connected to the first pole of the fuse and a second pole being accessible outside of the electrical system;
        a second dipole having a first pole connected to the external pin of functional module and a second pole connected to a preset voltage,
    wherein application of an isolating voltage, which is higher than the priming voltage applied between the second pole of the fuse and the second pole of the energizable semiconductor dipole, causes the fuse to physically break, enabling a preset voltage on the pin to be exclusively maintained via the second dipole.

2. The integrated electrical and/or electronic system according to claim 1, further comprising:
    a voltage generator that generates the isolating voltage.

3. The integrated electrical and/or electronic system according to claim 1, wherein the voltage generator is external to the electrical system.

4. The integrated electrical and/or electronic system according to claim 2, wherein the functional module comprises a controller that controls the isolating voltage generator.

5. The integrated electrical and/or electronic system according claim 1, wherein after the fuse breaks, the preset voltage applied to the pin of functional module corresponds to a preset logic level.

6. The integrated electrical and/or electronic system according to claim 5, wherein when the logic level is "1," the pin is connected to the preset voltage of the functional module via an element having a resistance with a sufficiently high equivalent impedance value to not disrupt operation of the electrical terminal before the fuse breaks.

7. The integrated electrical and/or electronic system according to claim 5, wherein when the logic level is "0," the pin is connected to a preset voltage of the functional module via an element having a resistance with a sufficiently high equivalent impedance value to not disrupt operation of the electrical terminal before the fuse breaks.

8. The integrated electrical and/or electronic system according to claim 6, wherein the element with a resistance is one of a resistor or a MOSFET-type resistor.

9. The integrated electrical and/or electronic system according to claim 1, wherein the energizable semiconductor dipole is one of a "zener"-type diode or a "transil"-type diode.

10. The integrated electrical and/or electronic system according claim 9, wherein the fuse is made of a nickel-chrome alloy on a substrate comprising at least one of glass, alumina and ceramics.

11. The integrated electrical and/or electronic system according to claim 1, wherein the electrical terminal is used for at least one of programming the functional module, configuring of the functional module, calibrating the functional module, receiving data or signals from the functional module, testing the functional module, and inserting a code into the functional module.

12. The integrated electrical and/or electronic system according to claim 1, wherein the system has at least two electrical terminals, each terminal being associated with a different isolation device.

13. The integrated electrical and/or electronic system according to claim 1, wherein the integrated electrical and/or electronic system is one of a hybrid integrated circuit, a monolithic integrated circuit, an electronic circuit, or an electrical circuit.

14. An electrical isolating device for electrically isolating a functional module in an electrical and/or electronic system, the functional module being connected to a supply voltage and also connected to the functional module by an electrical terminal via a pin, the electrical isolating device comprising:

a fuse having a first pole connected to the pin of the functional module and a second pole connected to the external electrical terminal;

a semiconductor dipole that is energized by a priming voltage, the semiconductor dipole having a first pole connected to the first pole of the fuse and a second pole being accessible outside of the electrical system;

a second dipole having a first pole connected to the external pin of functional module and a second pole connected to a preset voltage, wherein application of an isolating voltage, which is higher than the priming voltage applied between the second pole of the fuse and the second pole of the energizable semiconductor dipole, causes the fuse to physically break, enabling a preset voltage on the pin to be exclusively maintained via the second dipole.

* * * * *